United States Patent [19]
Nolan et al.

[11] Patent Number: 5,216,803
[45] Date of Patent: Jun. 8, 1993

[54] METHOD AND APPARATUS FOR REMOVING BONDED CONNECTIONS

[75] Inventors: Ernest R. Nolan, Round Rock; David H. Carey; Thomas A. Bishop, both of Austin, all of Tex.

[73] Assignee: Microelectronics And Computer Technology Corporation, Austin, Tex.

[21] Appl. No.: 805,167

[22] Filed: Dec. 11, 1991

[51] Int. Cl.$^5$ ............................................. H05K 3/00
[52] U.S. Cl. ................................. 29/829; 29/827; 29/426.1; 29/426.5; 29/762; 228/269
[58] Field of Search ............... 29/827, 762, 402.08, 29/829, 426.1, 426.5; 228/191, 264

[56] References Cited

U.S. PATENT DOCUMENTS

| | | |
|---|---|---|
| 3,735,911 | 5/1973 | Ward ....................................... 228/19 |
| 3,751,799 | 8/1973 | Reynolds . |
| 3,838,984 | 10/1974 | Crane et al. . |
| 3,969,813 | 7/1976 | Minetti et al. . |
| 4,012,832 | 3/1977 | Crane . |
| 4,567,643 | 2/1986 | Drouget et al. . |
| 4,586,252 | 5/1986 | Faticanti .................................. 29/762 |
| 4,771,932 | 9/1988 | Kim ................................. 228/264 X |
| 4,776,509 | 10/1988 | Pitts et al. ............................... 228/179 |
| 4,806,503 | 2/1989 | Yoshida et al. ....................... 437/206 |
| 4,934,582 | 6/1990 | Bertram et al. ....................... 228/191 |
| 4,991,286 | 2/1991 | Russo et al. ............................ 29/840 |
| 5,029,747 | 7/1991 | Russo et al. ........................... 228/4.5 |
| 5,056,217 | 10/1991 | Yamazaki et al. ................. 29/827 X |

OTHER PUBLICATIONS

IBM Tech Discl Bull vol. 19, No. 7 Dec. 1976 p. 2477 by Angelone.
Western Electric Tech DIG. No. 15 Jul. 1969, pp. 27–28 by J. E. Clark et al.

*Primary Examiner*—Carl J. Arbes
*Attorney, Agent, or Firm*—Fulbright & Jaworski

[57] ABSTRACT

Removing welded outer lead bonds of TAB tape leads to contacts on a substrate. The method includes separating the electrical leads adjacent the weld bonds leaving a remnant, engaging the remnant with a shear tool, and moving the tool and bond relative to each other shearing the remnant. In some cases the tool is ultrasonically vibrated in a direction transversely to the relative movement of the tool and bond.

11 Claims, 3 Drawing Sheets

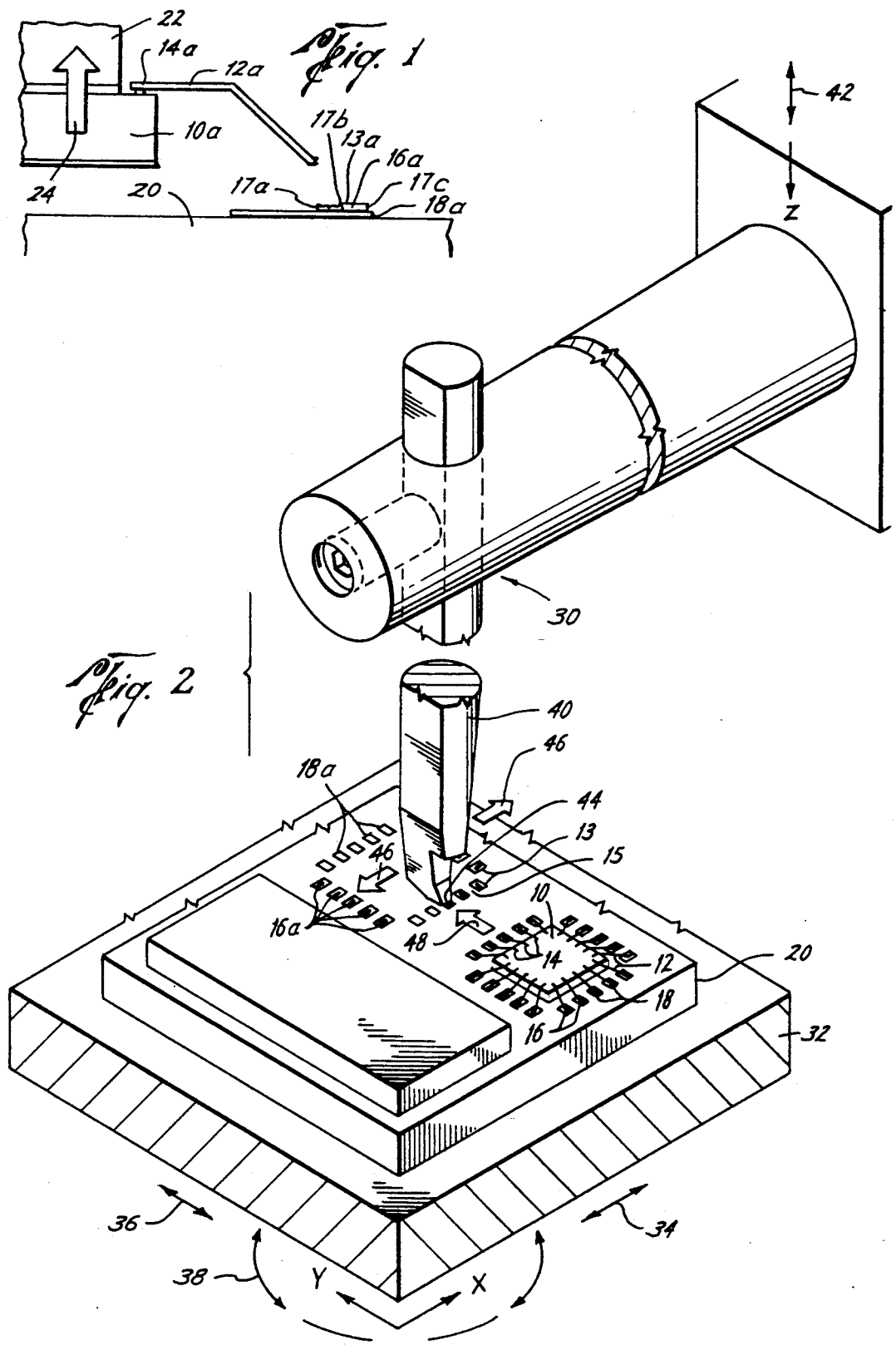

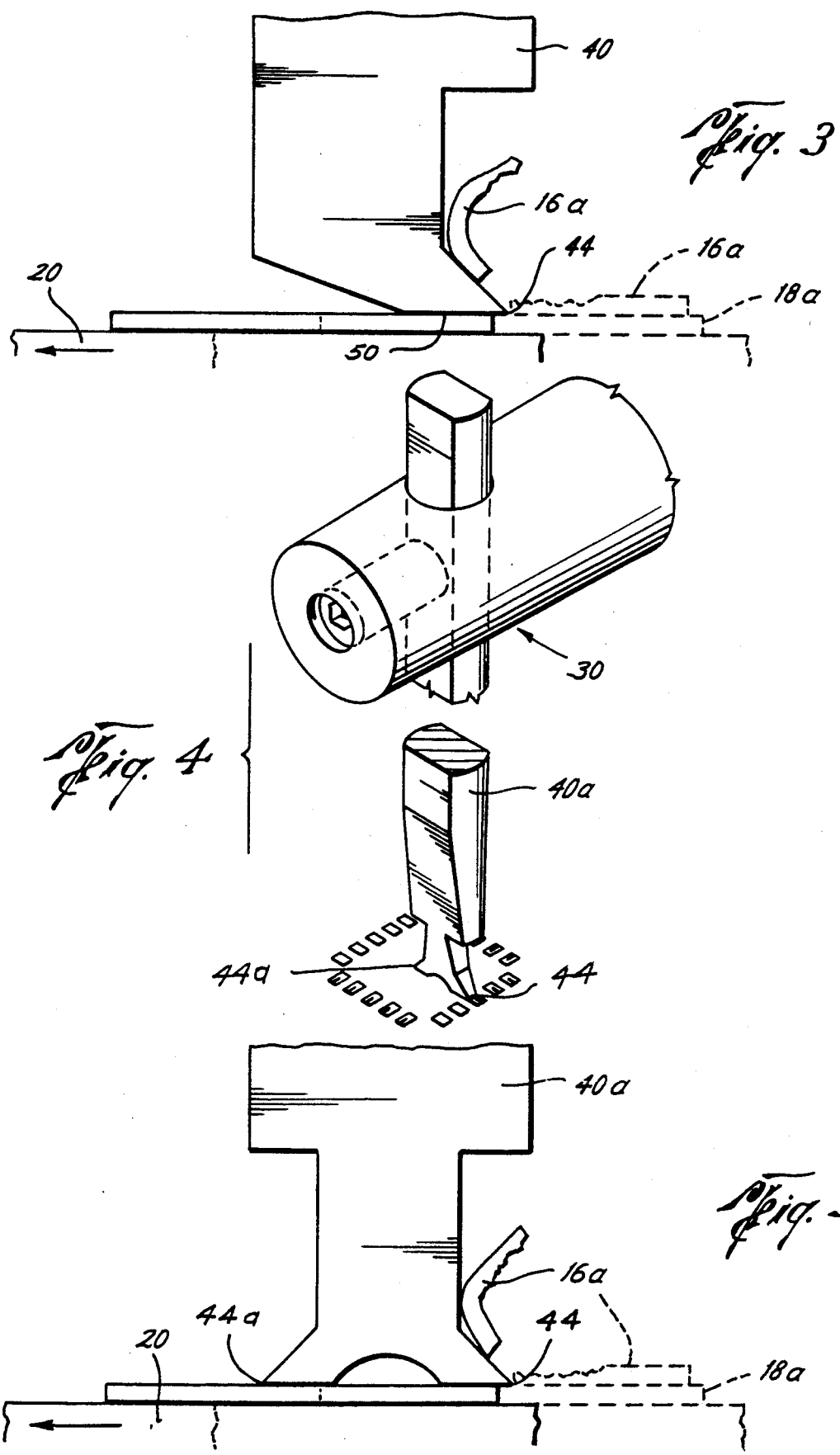

□ HIGH ENERGY, CONTROL
◇ HIGH ENERGY, 1 REWORK
○ HIGH ENERGY, 3 REWORK
0 LOW ENERGY, CONTROL
△ LOW ENERGY, 3 REWORK

METHOD AND APPARATUS FOR REMOVING BONDED CONNECTIONS

BACKGROUND OF THE INVENTION

The present invention is directed to a method and apparatus for removing welded outer lead bonds of TAB tape leads, and more particularly to the removal of defective electronic components having a plurality of outer lead bonds of TAB tape which are bonded to an electrical contact of a support, and still more particularly, is directed to a method for removing gold to gold TAB outer lead weld bonds.

When an electronic component fails it often becomes economically necessary to remove the failed device rather than replace the entire substrate. In the case where the electronic component has electrical leads which are solder bonded, this can be easily done by remelting the soldered connections and removing the defective components such as disclosed in U.S. Pat. No. 4,934,582. However, with certain hard welded electrical contact bonds, particularly such as gold to gold thermocompression and thermosonic bonds, such bonds have generally been considered irreparable because of the inability to remelt these bonds without damaging the underlying support. However, many users of TAB technology utilize gold plated tape and gold plated substrate pads because of military specifications and the desired high reliability. One repair method is suggested in U.S. Pat. No. 4,991,286 which removes the failed component by cutting off the leads and leaving the remnants of the old outer lead bonds in place. However, this method has not been widely accepted because of the required expensive tooling, reduced reliability, and/or more required substrate area.

The present method and apparatus removes the old outer lead bond remnants or stubs, leaving a bondable surface and unencumbered pad for subsequent TAB integrated circuit bonding in a process substantially identical to the original assembly process using the same tooling, equipment and procedure.

SUMMARY

A method of removing a welded outer lead bond of a TAB tape lead to a support or substrate in which the lead has a plurality of sides adjacent the bond. The method includes placing a shear tool having an elongate edge against one of said sides adjacent the bond, said elongate edge being positioned in a plane generally parallel to the plane of the bond, and moving the tool and bond relative to each other shearing the outer lead from the substrate.

Still a further object of the present invention is wherein the tool is vibrated in a direction transversely to the relative movement of the tool and the bond. Preferably, the vibration is ultrasonic.

Still a further object is wherein the elongate edge is at least as wide as the length of the contacted side.

Another further object of the present invention is guiding the bottom of the tool a precise height above the substrate for eliminating damage to the substrate.

Still a further object of the present invention is the method of removing defective electronic components having a plurality of electrical TAB leads having the outer ends weld bonded to electrical contacts of a substrate including separating the electrical leads adjacent the weld bonds leaving outer lead remnants having a plurality of sides adjacent the bonds. The method includes engaging one of the sides of each of the remnants with an elongate edge of a shear tool in which the elongate edge is positioned in a plane generally parallel to the plane of the bond and moving the tool and the remnants towards each other shearing the remnants from the substrate. The method may also include vibrating the tool in a direction transversely to the relative movement of the tool and the remnant. The method may also include engaging the side from which the electrical lead was separated. The method may further include wherein the welded outer lead bonds to the electrical contacts includes a gold plated lead and a gold plated contact.

Still a further object of the present invention is the apparatus for removing a welded outer lead bond of TAB tape lead to a substrate which includes a support for supporting the substrate and the outer lead welded bond. A shear tool is carried by the apparatus adjacent the support in which the shear tool includes an elongate edge positioned in a plane parallel to the plane of the support for engaging the bonded lead and the elongate edge has a length at least as long as the width of the bond. The apparatus also includes means for moving the support and the tool in a first direction relative to each other for moving the tool towards the bond. The apparatus may also include means for vibrating the tool in a direction transversely to the first direction and preferably ultrasonically.

Yet a further object of the present invention is wherein the length of the elongate edge is less than the width of the bond plus the spacing between bonds on the substrate so as to engage only a single stub.

Preferably, the tool also includes a second elongate edge spaced 180° from the first elongate edge.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 1 is an elevational fragmentary schematic view illustrating one method of removing an electronic component and separating the outer leads from a welded bond, FIG. 2 is a fragmentary isometric projection of an ultrasonic single edge tool holder positioned to shear bonded TAB lead stubs from substrate pads, FIG. 3 is a fragmentary elevational enlarged vertical side view of the tool of FIG. 2 shearing the stub, FIG. 4 is a view similar to FIG. 2 but illustrating a double edged tool, FIG. 5 is a view similar to FIG. 3 but having the double edged tool of FIG. 4.

DESCRIPTION OF THE PREFERRED EMBODIMENT

Figure 6:
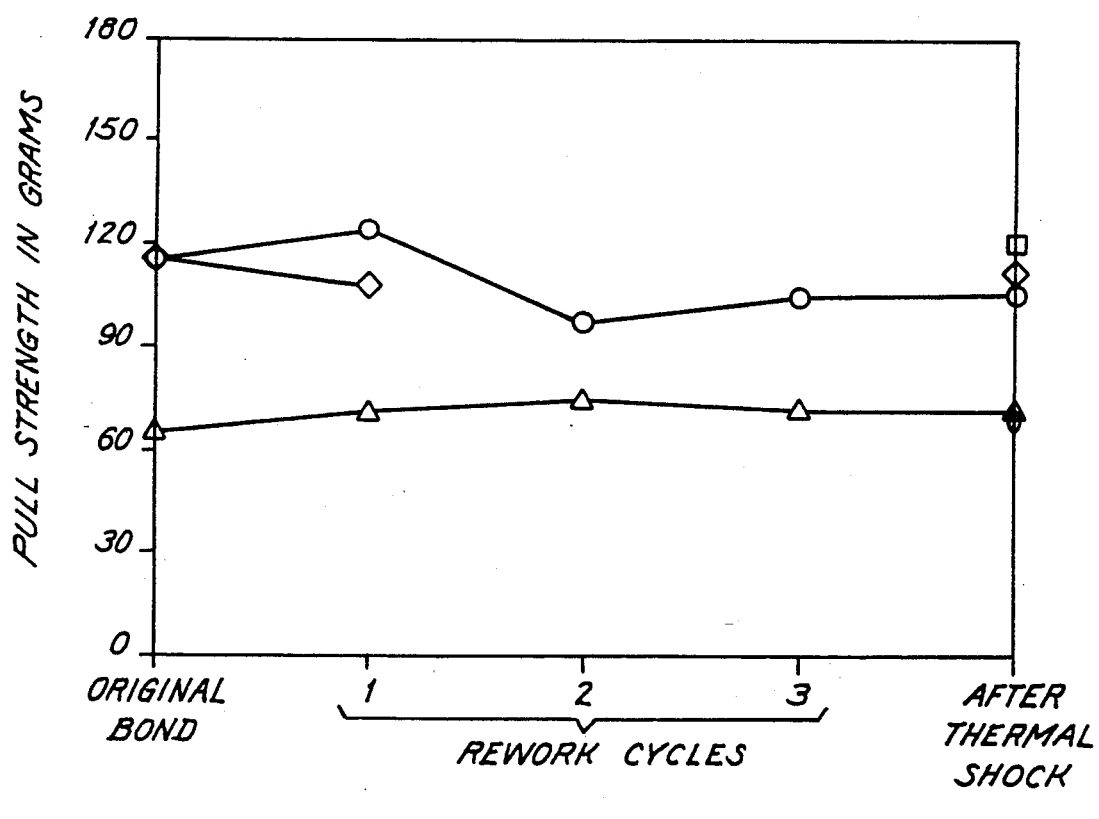
FIG. 6 is a chart showing pull strength comparisons after successive rework cycles of various bonds.

Referring now to the drawings, and particularly to FIG. 2, an electronic component 10, such as a chip, has a plurality of electrical leads 12, which may be tape automated bonded (TAB) tape leads. The inner ends 14 are bonded to the component 10 and the outer lead ends 13 are bonded at bonds 16 to electrical contacts, such as pads or bumps 18, on a support 20 which may be a substrate, a single chip package, or a multi-chip substrate. The outer end 13 of each lead 12 is weld bonded to a contact 18 by any suitable means, such as a laser, a thermocompression or thermosonic bonding tool, as is conventional.

The above described method of attaching an electronic component 10 and electrically weld bonding it to a support 20 is well known. However, the electronic component 10 may be defective and unless it can be replaced with a new component, an entire multi-chip package or completed assembly must be scrapped.

However, in the past where the bonds 16 between the outer ends 13 of the leads 12 and the contacts 18 were a welded bond, and particularly in the case of a gold plated outer end 13 to a gold plated copper bond pad 18, such bonds were generally considered irreparable because of the inability to remelt these bonds without damaging the support package or substrate 20.

Referring now to FIGS. 1, 2, and 3, the removal of a defective electronic component 10a, its TAB leads 12a and its outer lead bonds 16a by the present invention is best seen. Referring to FIG. 1, it is preferable to first remove the component 10a and separate the TAB leads 12a from all the outer lead bonds 16a. While this can be done with the cutting tool described in U.S. Pat. No. 4,991,286, the preferable method is to remove the die 10a from the substrate 20 by use of a pulling tool 22, such as a vacuum pipette as described in U.S. Pat. No. 4,934,582, or any suitable pulling tool using a thermoplastic or other adhesive with suitable melting temperature, tensile strength and adhesion strength. The pulling tool 22 is attached to the die 10a and is pulled upwardly in the direction indicated by the arrow 24, possibly with a twisting motion, pulling the electronic component 10a from the substrate 20, and severing the TAB leads 12a. However, since the bond between the outer end of the lead 12a to the contact 18a is normally stronger than the leads 12a, the leads will sever, but will leave a remnant or stub consisting of the outer end 13a. This leaves the outer end 13a of the lead having a plurality of sides exposed adjacent to the bond with the contact 18a. Sides 17a, 17b and 17c are best seen in FIG. 1. Any residual die attach material is removed from the substrate 20.

Referring now to FIGS. 2 and 3, an apparatus generally indicated by the reference numeral 30 is shown for removing the remnants or stubs of the outer lead bonds 16a of the TAB tapes 12a from the substrate 20. The apparatus 30 includes a support 32 such as a positioning stage for supporting the substrate 20. The positioning stage has the capability of moving in the X direction as indicated by the arrows 34, in the Y direction as indicated by the arrows 36, and in a rotational direction, as indicated by the arrows 38, for reasons as will be more fully discussed hereinafter. The apparatus 30 also includes a shear tool 40 carried by the apparatus adjacent the substrate 30 which can be moved in the Z direction as indicated by the arrows 42. The shear tool 40 includes an elongate edge 44 which is positioned in a plane parallel to the plane of the support for engaging the bonded remnant or stub of the outer lead bond 16a. Preferably the elongate edge 44 has a length at least as long as the width of one of the sides 17a, 17b and 17c for applying a force across the entire engaged side. However, the edge 44 preferably has a width less than the width of the bond plus the width of the space 15 between adjacent contacts or pads 18. That is, the purpose of the elongate edge 44 is to shear the remnant or stub one at a time from the substrate 20. Normally, the plurality of bonds between the outer lead ends 13a and the contacts 18a are not sufficiently all in the same plane to allow shearing more than one at a time. While the remnants may be sheared by engaging any of the sides, such as 17a, 17b, 17c and the unnumbered side, it is preferable to engage side 17a where the TAB lead 12a has been severed, as this provides a suitable space for movement and actuation of the tool 40 without interfering with other components on substrate 20. The elongate edge 44 of the shear tool is placed against one of the sides, such as 17a, adjacent the bond, and relative movement between the bond and the tool 40 is provided to move tool 40 and the bond toward each other, as indicated by arrow 48, for shearing stub 16a from substrate 20. Preferably, the tool 40 remains in position and substrate 20 is moved in the direction 36 by action of the positioning stage 32. Preferably, the tool 40 is constructed of a material such as titanium carbide or tungsten carbide for long life. Special hardening or coating treatment such as diamond can be used to further enhance tool life.

Referring now to FIG. 3, the bonded outer lead remnant 16a is shown in dotted outline prior to removal. After removal by the tool 40, the lead remnant 16a is shown in solid outline. Preferably, the bottom 50 of tool 40 is guided a precise height above substrate 20 for eliminating damage to the substrate. This may be accomplished by contacting bottom surface 50 to substrate 20 and detecting the contact with a force transducer, and then raising bottom surface 50 in the range of 6-12 microns above substrate 20 and suspending tool 40 at that height. Alternatively if desired, tool 40 may contact substrate 20 during the removal operation and contain a flat lower surface 50 for preventing damage to the substrate 20. It has been found that merely shearing the remnants or stubs by the movement of the tool 40 relative to the remnants removes the old outer lead remnants 16a leaving a bondable gold surface and unencumbered pad for subsequent integrated circuit TAB bonding in a process identical to the original assembly process. That is, when the strength of the bonds is low, such as about 60 grams, the remnants or subs can be easily removed without only relative movement between the tool 40 and the bonded connections 16a. However, for higher strength bonds, such as approximately 120 gram bonds, it has been found advantageous to vibrate the tool 40 in the direction indicated by the arrows 46 in FIG. 2 which are transverse to the direction indicated by the arrow 48. Advantageously, the apparatus 30 supporting the tool 40 may be a conventional thermosonic bonding apparatus such as used to bond the outer ends 13a to the contacts 18a. For example, a thermosonic wire bonder, Model No. 2401, sold by Kulicka and Soffa, or a TAB single point bonder, Model 2460-II, sold by Hughes Aircraft Co. are satisfactory. The ultrasonic frequency used is the same ultrasonic settings used for bonding.

After removal of the component 10a and outer lead stubs 16a, a new electronic component can now be aligned, die attached and outer lead bonded in a process identical to the first time assembly process. The new bonds can be located adjacent to or on the previously repaired bond sites. In order to increase the life of the tool 40, a double edged tool 40a is provided in FIGS. 4 and 5, which is identical to tool 40 in operation, but can be reversed for extending its life by having a first elongate edge 44 and a second elongate edge 44a rotationally spaced from the first elongate edge 44.

By way of example only, the tool 40 and 40a has an elongate edge 44 and 44a of approximately four mils for removing bonds in which the outer lead bonds measured approximately 3 mils wide by 1.4 mils thick, and in which the contacts 18 were spaced on 6 mil pitches.

Referring now to FIG. 6, a graph or chart is shown showing the pull strength required to break a bond that has been welded under various conditions. This chart shows that reworked or rebonds that are made after one or more cycles of removing bonded connections, in accordance with the present invention, are substantially as strong as the original bonds. The chart illustrates the test grams of pull required to remove a bond at the original bond, one rework or rebond cycle, two rework or rebond cycles, three rework or rebond cycles, and after thermal shock testing. It is to be understood that the low energy level tests (approximately 60 grams) were on bonds which were applied after removal of prior bonds without the use of ultrasonic vibration.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts and steps of the process will be readily apparent to those skilled in the art, and which are encompassed within the spirit of the invention and the scope of the appended claims.

What is claimed is:

1. A method of removing a welded outer lead bond of a TAB tape lead to a substrate in which the lead has a plurality of sides adjacent the bond, comprising:
   placing a shear tool having an elongate edge against one of said sides and adjacent the bond, said elongate edge being positioned in a plane generally parallel to but above the plane of the bond,
   moving the tool and bond relative to each other shearing the outer lead bond from the substrate by movement of the lead relative to the bond, and
   guiding the bottom of the tool a precise height above the substrate for eliminating damage to the substrate.

2. The method of claim 1 wherein the welded outer lead bond of the TAB tape lead to the substrate is a gold to gold bond and the step of shearing the outer lead bond from the substrate leaves a bondable gold surface on the substrate.

3. A method for removing a welded outer lead bond of a TAB tape lead to a support in which the lead has a plurality of sides adjacent the bond, comprising:
   placing a shear tool having an elongate edge against one of said sides and adjacent the bond, said elongate edge being positioned in a plane generally parallel to the plane of the bond,
   moving the tool and bond relative to each other shearing the outer lead bond from the support, and
   vibrating the tool in a direction transversely to the relative movement of the tool and the bond.

4. The method of claim 3 wherein the vibration is ultrasonic.

5. A method for removing defective electronic components having a plurality of electrical TAB leads having the outer ends weld bonded to electrical contacts of a substrate, comprising:
   separating the electrical leads adjacent the weld bonds leaving outer lead remnants having a plurality of sides adjacent the bonds,
   engaging one of the sides of each of the remnants with an elongate edge of a shear tool, said elongate edge being positioned in a plane generally parallel to the plane of the bond, and
   moving the tool and each remnant toward each other shearing the remnants from the substrate.

6. The method of claim 5 including,
   vibrating the tool in a direction transversely to the relative movement of the tool and each remnant.

7. The method of claim 5 wherein the engaged side is the side from which the electrical lead is separated.

8. The method of claim 5 wherein the welded outer lead bonds to the electrical contacts includes a gold plated lead and a gold plated contact.

9. An apparatus for removing a welded outer lead bond of a TAB tape lead to a substrate, comprising:
   a support for supporting the substrate and the welded outer lead bond,
   a shear tool carried by the apparatus adjacent the support, said shear tool including an elongate edge positioned in a plane parallel to the plane of the support for engaging the welded outer lead bond, said elongate edge having a length at least as long as the width of the bond,
   said apparatus having means for moving the support and tool in a first direction relative to each other for moving the tool towards the bond, and
   means for vibrating the tool in a direction transversely to said first direction.

10. An apparatus for removing a welded outer lead bond of a TAB tape lead to a substrate, comprising:
    a support for supporting the substrate and the welded outer lead bond,
    a shear tool carried by the apparatus adjacent the support, said shear tool including an elongate edge positioned in a plane parallel to the plane of the support for engaging the welded outer lead bond, said elongate edge having a length at least as long as the width of the bond,
    said apparatus having means for moving the support and tool in a first direction relative to each other for moving the tool towards the bond, and
    said tool including a flat surface beneath the elongate edge for guiding the tool without damaging the substrate.

11. An apparatus for removing a welded outer lead bond of a TAB tape lead to a substrate, comprising:
    a support for supporting the substrate and the welded outer lead bond,
    a shear tool carried by the apparatus adjacent the support, said shear tool including an elongate edge positioned in a plane parallel to the plane of the support for engaging the welded outer lead bond, said elongate edge having a length at least as long as the width of the bond,
    said apparatus having means for moving the support and tool in a first direction relative to each other for moving the tool towards the bond, and
    said tool includes a second elongate edge rotationally spaced from the first elongate edge.

* * * * *